United States Patent [19]
Rischke et al.

[11] Patent Number: 5,512,154
[45] Date of Patent: Apr. 30, 1996

[54] APPARATUS FOR SELECTIVELY ELECTROPLATING APERTURED METAL OR METALLIZED PRODUCTS

[75] Inventors: Jorg W. Rischke, Veldhoven; Wilhelmus G. L. van Sprang, Eindhoven, both of Netherlands

[73] Assignee: MECO Equipment Engineers B.V., 's-Hertogenbosch, Netherlands

[21] Appl. No.: 186,907

[22] Filed: Jan. 27, 1994

[30] Foreign Application Priority Data

Jan. 28, 1993 [NL] Netherlands ............... 9300174

[51] Int. Cl.$^6$ ............................................... C25D 5/02
[52] U.S. Cl. ............ 204/204; 204/203; 204/224 R; 204/622; 204/624; 205/128
[58] Field of Search ........................ 205/128, 129; 204/202, 203, 204, 205, 224 R, 300 EC, 206, 207, 211; 430/313, 314, 315

[56] References Cited

U.S. PATENT DOCUMENTS

| | | | |
|---|---|---|---|
| 3,819,502 | 6/1974 | Meuldijk et al. | 204/206 |
| 3,855,108 | 12/1974 | Bolz et al. | 204/206 |
| 4,376,017 | 3/1983 | Urion | 204/15 |
| 4,404,079 | 9/1983 | Jahani | 204/224 R |
| 4,411,982 | 10/1983 | Shibuya et al. | 430/314 |
| 4,493,757 | 1/1985 | Piepers | 204/206 |
| 5,183,724 | 2/1993 | Johnson | 430/312 |

FOREIGN PATENT DOCUMENTS

| | | |
|---|---|---|
| 0055130 | 7/1984 | European Pat. Off. . |
| 0382283 | 8/1990 | European Pat. Off. . |
| 0507043 | 10/1992 | European Pat. Off. . |

*Primary Examiner*—John Niebling
*Assistant Examiner*—William T. Leader
*Attorney, Agent, or Firm*—Oblon, Spivak, McClelland, Maier & Neustadt

[57] ABSTRACT

The invention relates to an apparatus for selectively electroplating apertured products. The products are masked in accordance with the intended plating and subsequently exposed to an electrolyte in order to electroplate the products. For masking purposes a fully closed photoresist layer is electrophoretically applied to the products, and after drying of the photoresist layer, the products are covered with a photomask in accordance with the locations to be plated, after which exposure takes place. Then the photoresist layer is partially removed, while the remaining part of the photoresist layer remains behind on the products, to serve as a mask for the metal products upon electroplating.

14 Claims, 10 Drawing Sheets

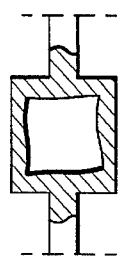
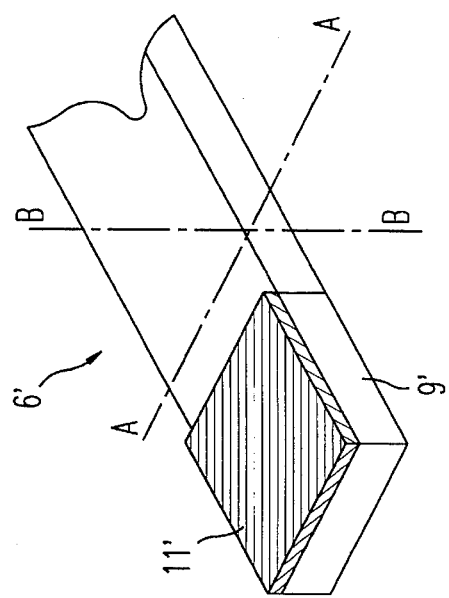
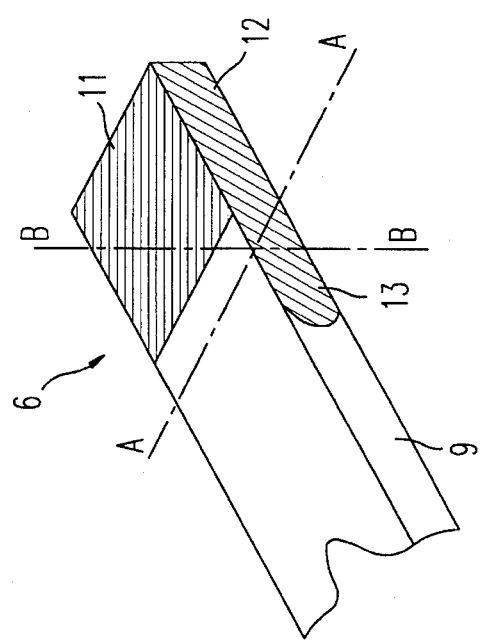
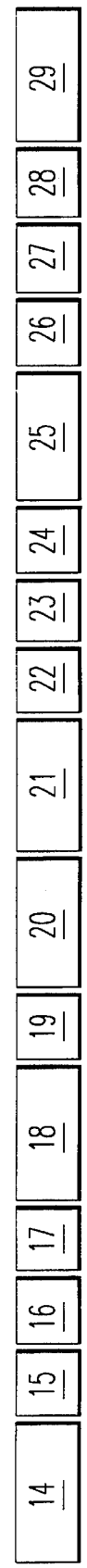

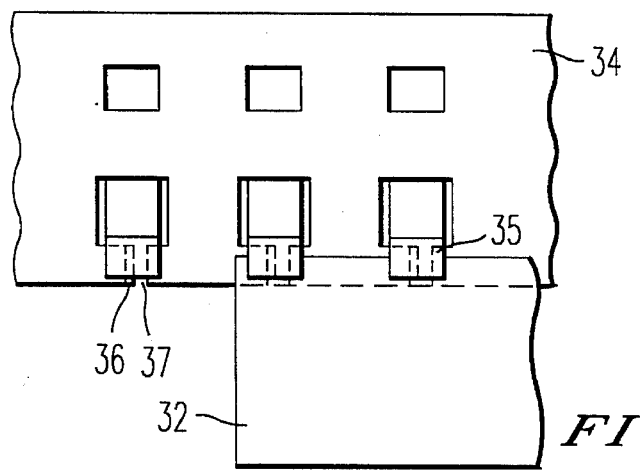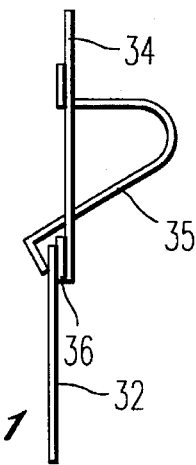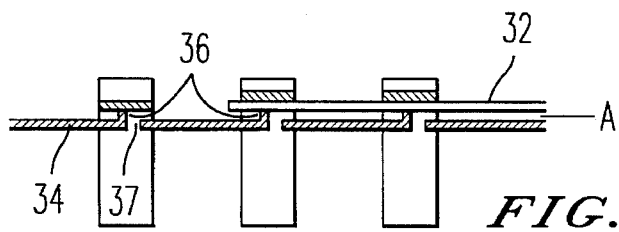
FIG. 11
FIG. 12
FIG. 13
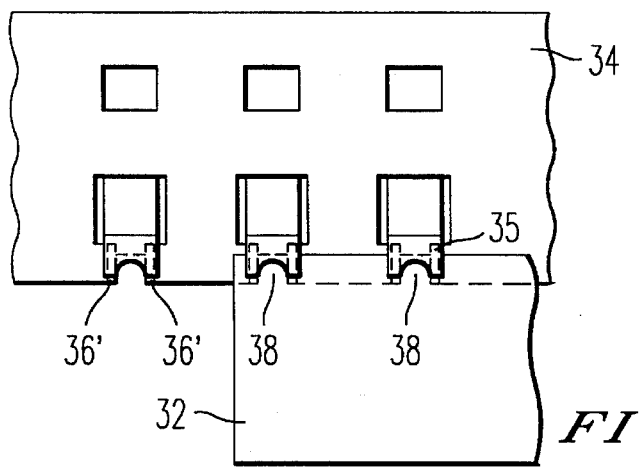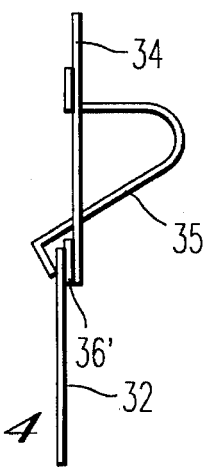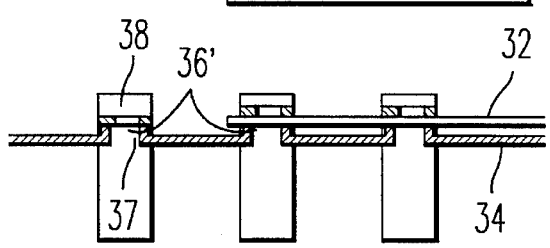
FIG. 14
FIG. 15
FIG. 16

APPARATUS FOR SELECTIVELY ELECTROPLATING APERTURED METAL OR METALLIZED PRODUCTS

BACKGROUND OF THE INVENTION

The present invention relates to an apparatus for selectively electroplating apertured metal or metallized products obtained by stamping or etching. In the invention, a fully closed photoresist layer is electrophoretically applied to the apertured products, and after drying of the photoresist layer, the apertured products are covered with at least one photomask at desired locations, followed by exposure of the products covered with (a) photomask(s), after which the photoresist layer is removed, by means of a developing process, from the parts of the apertured products to be electroplated after removal of the photomask(s), while the remaining part of the photoresist layer on the apertured products serves as a mask for the metal products upon electroplating those parts of the apertured products from which the photoresist layer has been removed.

In the industry use is frequently made of metal or metallized products, which for technical and/or economic reasons must be selectively electroplated, mostly with a precious metal. Generally it is required that the electroplating must take place as accurately as possible on the intended places, since plating of non-intended parts may lead to malfunctions when the product is being used and/or to undesirable consumption of the costly plating material.

FIG. 1 shows a typical example of such a product in the shape of a metal frame which is known per se, a so-called leadframe 1, with parts of leadframes contiguous thereto. Such leadframes are usually stamped or photochemically etched from a metal band or strip or obtained by photochemically etching of a metal foil applied to a film of plastic material.

FIGS. 2 and 3 likewise show products known per se, which are interconnected in endless product bands or strips, FIG. 2 showing an example of products 2 used for transistors and FIG. 3 showing an example of products 3 used for contact systems.

These products have parts, which are indicated by hatched portions in FIGS. 1–3, which are to be plated with a metal. It is also possible that only a small part of a surface must be plated, for example the part indicated by black planes in FIG. 3. Furthermore these products are provided with a larger or smaller number of apertures 4, which at least partially surround the areas to be plated with a metal.

Although it will also be possible to use the apparatus according to the invention to be described hereafter for products such as those shown in FIGS. 2 and 3, the invention will be explained in particular with reference to its use with the so-called leadframes, since these products are of a generally very vulnerable, complicated structure, while in particular with these products very strict requirements are made with regard to the plating of a metal solely on the intended places, while using a minimum amount of plating material.

As already noted such leadframes, which are initially interconnected in elongated bands or strips, are usually made by etching or stamping. In order to be able to carry out such plating of metal products as accurately as possible, there have been quite a few developments over the years, as for example described in U.S. Pat. Nos. 3,746,730, 3,819,502, 3,855,108, 4,376,017 and 4,493,757, and also in European Patent Applications Nos. 0055130 and 0382283. As is apparent from these publications the bands or strips may thereby be continuously or intermittently transported through the processing apparatus, while during the intended electroplating mechanical masks, such as belts of a flexible material moving along with the products or pads of a flexible material, which are intermittently pressed against the products, cover those parts of the products which must not be plated.

When using a leadframe 1 as shown in FIG. 1, a chip is usually placed on a platform 5 and connected to the ends of the leads 6 located nearby the platform by means of gold or aluminum wires. Then the platform and the chip and the ends of the leads 6 connected to the chip are encapsulated in plastic material and the surplus parts outside the package of plastic material are cut from the leadframe shown, while the parts of the leads 6 projecting from the package of plastic material will be used for connection into an electronic circuit, such as for example, a printed circuit or the like.

The embodiment of the leadframe diagrammatically illustrated in FIG. 1 is of very simple construction. In practice leadframes having more than 200 leads are sometimes used. An example of a leadframe 1a having 208 leads is shown in FIG. 4. Usually such products having a very complicated structure and comprising a large number of leads are not manufactured in the form of elongated bands to be wound on coils, but in the shape of strips having a length of 150–240 mm.

In addition to the increasing integration of functions at chip level, with the increase in the number of leads per chip resulting therefrom, there is a tendency to reduce the thickness of both the metal used for the leadframe and the above-mentioned package of plastic material, in which the chip and the leads on the chip are encapsulated. It is already being attempted to reduce the thickness of the leadframe material from the usual 0.25–0.35 mm to 0.08–0.15 or less, while an aim is to achieve a package thickness in the order of ±1.2 mm instead of the 3.0 mm of the packages used so far.

This miniaturization trend may be expected to continue.

Increasingly strict requirements are made of the accuracy of position and form of the metal selectively plated onto the products, also with a view to the reliability of the end products in which such leadframes provided with chips are used.

It is no longer possible to realize these strict requirements with the mechanical masks that have been used so far, wherein use is made of upper and/or lower masks, of which at least those parts that come into contact with the products are usually made of resilient material, and wherein at least one of the masks is furthermore provided with passages in accordance with the selectively plating to be carried out on the products.

Thus FIG. 5 schematically shows a sectional view of a number of leads 6, which are clamped between an upper mask 7 and a lower mask 8, as is usual when the above-described apparatuses are used for electroplating.

As is apparent from FIG. 5, channels 10 are thereby present between the cut edges 9 of the leads, in which an electrolyte may flow during the intended electroplating, so that not only an intended part 11 of a lead 6 (FIG. 6) will be plated with a metal, but also, at 12, the cut edge 9, as indicated by the hatched portion in FIG. 6.

FIG. 6 also indicates, by means of lines A—A and B—B, the boundary of the package of plastic material referred to above. In practice it often occurs that the undesirable metal coating, usually consisting of silver, which is formed on the cut edge 9, extends beyond such a package of plastic material, as indicated by a cross-hatched portion 13. The fact that the plating material, silver, projects from the package of plastic material involves the risk of a short-circuit among the leads as a result of the migration of silver over the surface of the plastic material.

Furthermore the material of the aforesaid package bonds much better to the base material than to the plated material, so that also in view of the bonding the presence of plating material on non-functional places is disadvantageous.

Also the platform 5 (FIG. 1) must be provided with an intended metal coating only at the side on which the chip is provided. When using the techniques comprising mechanical masking systems that have been used so far, it becomes apparent, however, that in particular with the, complicated leadframes made of a very thin material, using the masking techniques that have been usual so far, electrolyte will seep through and along the cut edges of the platform to that side of the platform which faces away from the side on which the chip is to be provided, so that in the end product the side of the platform 5 facing away from the chip is also at least partially plated with a metal, as indicated by a hatched portion in FIG. 7. As already stated, this has an adverse effect on the bonding of the package of plastic material encapsulating the central platform with the chip, so that it is desirable to avoid such plating of the rear side.

Besides the problems referred to above there is also a great risk of mechanical damage, such as bending of the platform and/or of the leads and the indexing holes when using the mechanical masking systems that have been usual so far with the above-described, particularly vulnerable leadframes. This may already be caused by pressing the mechanical masking systems against the very thin products with the required force. Furthermore the vulnerable parts of the leadframes tend to stick to the masking systems when the mechanical masking systems move in a direction away from the leadframes, as a result of which the further transport of the leadframes is interfered with and successive products will come into contact with each other.

In order to be able to meet the increasingly strict requirements with regard to the accuracy with which metal products are to be plated, the applicant has contemplated covering the metal products with dry films of a photosensitive material and locally exposing the films in accordance with the intended plating, in order to be able to subsequently uncover the metal product again at desired locations, by means of a developing process, with a view to carrying out the plating. When such films are applied to either side of apertured products it becomes apparent, however, that after exposure and developing the films present on the front and rear sides of the product do not properly abut each other between the apertures, resulting in channels being formed, while also the cut edges of the apertures provided in the product are not masked in the product surface uncovered by exposure and developing. Consequently, the cut edges of the apertures in the uncovered surface and at least part of the channels present between the upper and lower films are undesirably plated in the final plating process, in a similar manner as described above with reference to FIGS. 5 and 6.

Furthermore it has been contemplated to immerse the products in or spray them with liquid photosensitive materials and to expose desired places of the photosensitive materials in a similar manner as described above. It became apparent thereby, however, that after drying of the photosensitive layer the photosensitive layer had withdrawn to such an extent at sharp edges and burrs possibly present on the edges, that the photosensitive layer remaining behind at that location was porous and provided insufficient protection when plating was carried out following exposure and developing, so that plating also took place on undesirable places along the insufficiently protected edges and/or burrs, with all the disadvantages attached thereto.

The disadvantages resulting from the use of mechanical masking systems and of photosensitive foils or liquid photoresists can be avoided by using the method referred to in the introduction, wherein, as described in European Patent Application No. 0507043, a photoresist layer is electrophoretically applied on the apertured products. As described in EP-A-0507043, the apertured products are immersed in a photoresist bath for that purpose, whereby, dependent on the photoresist being used, the product is used as an anode or a cathode. The product is kept immersed in the bath thereby until the desired photoresist layer has grown on the product, which becomes visible in that the current applied has become zero or practically zero. In order to promote the formation of a satisfactory coating thereby, the photoresist bath is preferably vibrated. The electrophoretic resist layer applied, fully encloses all parts of the apertured products, sharp edges included.

Immersing the product, connecting the product to a power source, keeping the product immersed in the bath for some time and subsequently disconnecting the power source and removing it from the bath again all add up to the fact that this is a very time-consuming method.

SUMMARY OF THE INVENTION

According to the present invention the apertured products are continuously transported through a photoresist bath in operation, while the products are connected to a power source, at least from the time they enter the bath until they exit from the bath.

According to the present invention, a simple and quick production of products provided with photoresist layers can be obtained as a result of the continuous transport of the products through the bath. Surprisingly it has become apparent thereby that an even growth of the photoresist layer on the product takes place along the entire path of travel of the product through the photoresist bath, this in contrast to what was expected, namely that an irregular structure of the photoresist layer would be obtained since the growth of the photoresist layer would mainly take place nearby the place of entry of the product into the bath, while there would be practically no growth at locations further away from the inlet opening, the result being that either a quick transport of the products through the bath would become impossible or that a very irregular, not fully closed photoresist layer would be formed on the products. It moreover appeared, that in case of a continuous transport of the products through the electrophoretic bath the time required for applying a fully closed photoresist layer could be considerably shorter than with batch production, while in addition to that a considerably lower bath voltage could be used (5 seconds instead of 30–60 seconds, 30–50 V instead of 60–125 V).

According to the present invention a particularly effective apparatus for implementing this method may be obtained when the apparatus is provided with a bath for applying a photoresist layer, with means for exposing the photoresist layer and with means for transporting the products through the apparatus, while at least one photomask is provided, which is horizontally and vertically adjustable relative to the products under the influence of an apparatus which detects marks present on the products and on the mask. It is possible thereby to effect an accurate adjustment of the mask relative to the products during transport of the products through the apparatus.

An effective control of the flow of the liquid in the bath for applying the photoresist layer is obtained when two spaced-apart pairs of rollers are provided within the bath, in such a manner that the products can be passed between the pairs of rollers. The pairs of rollers may thereby act as a kind of sluice and maintain the liquid level in the bath at a desired level.

Preferably a plurality of spaced-apart anodes are arranged one behind the other in the plating bath, as seen in the intended direction of travel of the products, while transversely arranged partitions are disposed between the anodes and furthermore means are provided, by which the anodes may be selectively connected to a power source. By suitably controlling the energizing of the anodes at the time of starting and stopping the operation of the apparatus and also during operation of the apparatus a uniform plating on the intended places can be effected.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6 is a schematic view of one end of a lead of a leadframe, which is partially plated with a metal;

FIG. 7 is a schematic rear view of a platform of a leadframe;

FIG. 8 is a schematic view of one end of a lead of a leadframe, which is partially plated with a metal by using the method according to the invention;

FIG. 9 is a schematic view of a succession of stations, through which products to be plated can be transported;

FIGS. 11, 12 and 13 show an embodiment of readily rinsable clamping means for connecting products joined in strips to the endless conveyor-belt;

FIGS. 14, 15 and 16 show another embodiment of readily rinsable clamping means;

DESCRIPTION OF THE PREFERRED EMBODIMENTS

Figure 1:
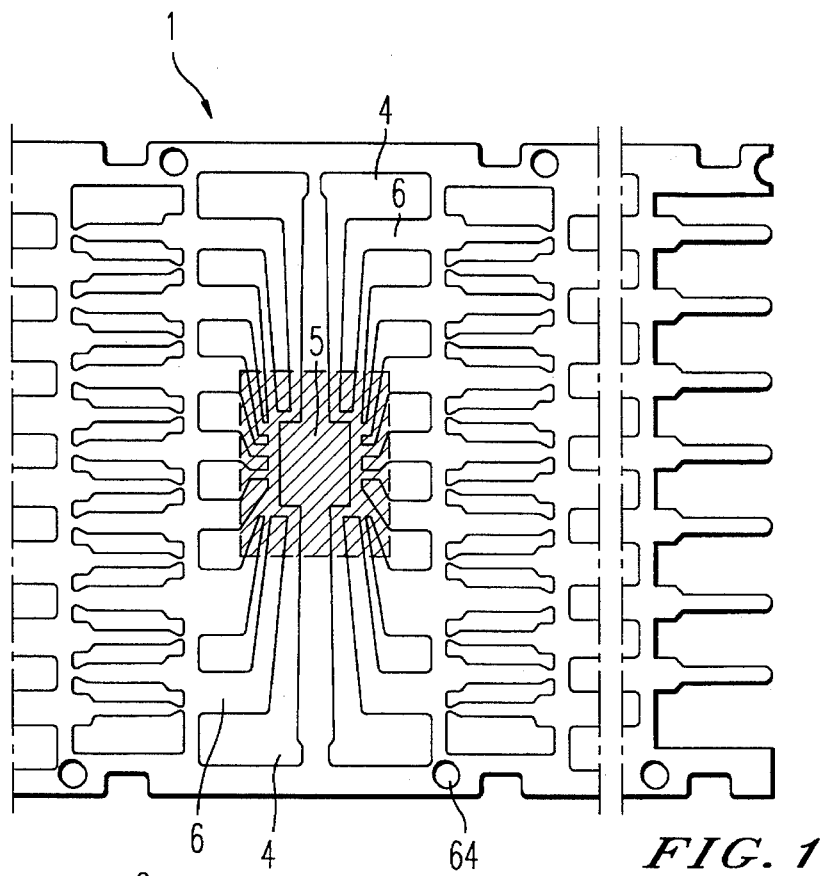
FIG. 1 is a schematic view of a metal product known per se, in the shape of a so-called leadframe.
Figure 2:
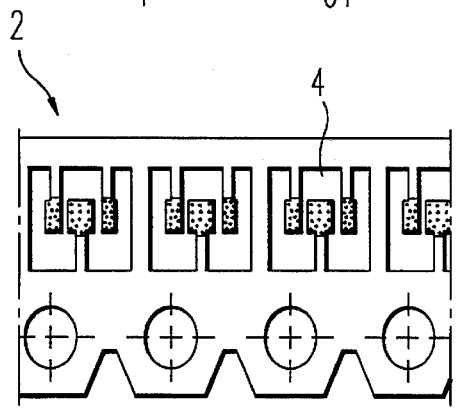
FIG. 2 is a schematic view of a number of products in the shape of transistor parts interconnected in a band or strip.

Conventionally the products to be plated, which are interconnected in elongated bands or strips, are subjected to a number of processing steps in an apparatus. As is schematically illustrated in FIG. 9, such an apparatus may comprise a number of processing stations 14–29.

In station 14 the products will be supplied to the apparatus.

In station 15 the products will be degreased in the usual manner, while in station 16 the products will for example be activated in an acid bath. Then the electrophoretic application of a photoresist layer, takes place in station 18.

In station 19 recuperation rinsing may take place, while subsequently the photoresist layer is dried in station 20. Then the desired mask(s) will be applied in station 21, after which the products will be exposed.

Then a developing process may be carried out in station 22, with a view to removing the mask from the parts to be plated with a metal, which parts may be activated by mild etching in station 23. The stations 24 and 25 may be used for the intended plating in the usual manner, after which the photoresist remaining behind after developing may be removed from the products, insofar as necessary, in station 26. In station 27 a final cleaning treatment may be carried out, followed by drying of the products in station 28, if necessary. In station 29 the plated products may be removed from the apparatus.

A particularly suitable apparatus 30 (FIG. 10) for processing products interconnected in strips or elongated bands so as to carry out the invention may be designed according to the same principle as the apparatus described in EU-A-0382283, whose contents shall be considered to be incorporated herein, so that it will not be necessary to discuss the construction and the operation of the apparatus in detail herein.

Figure 10:
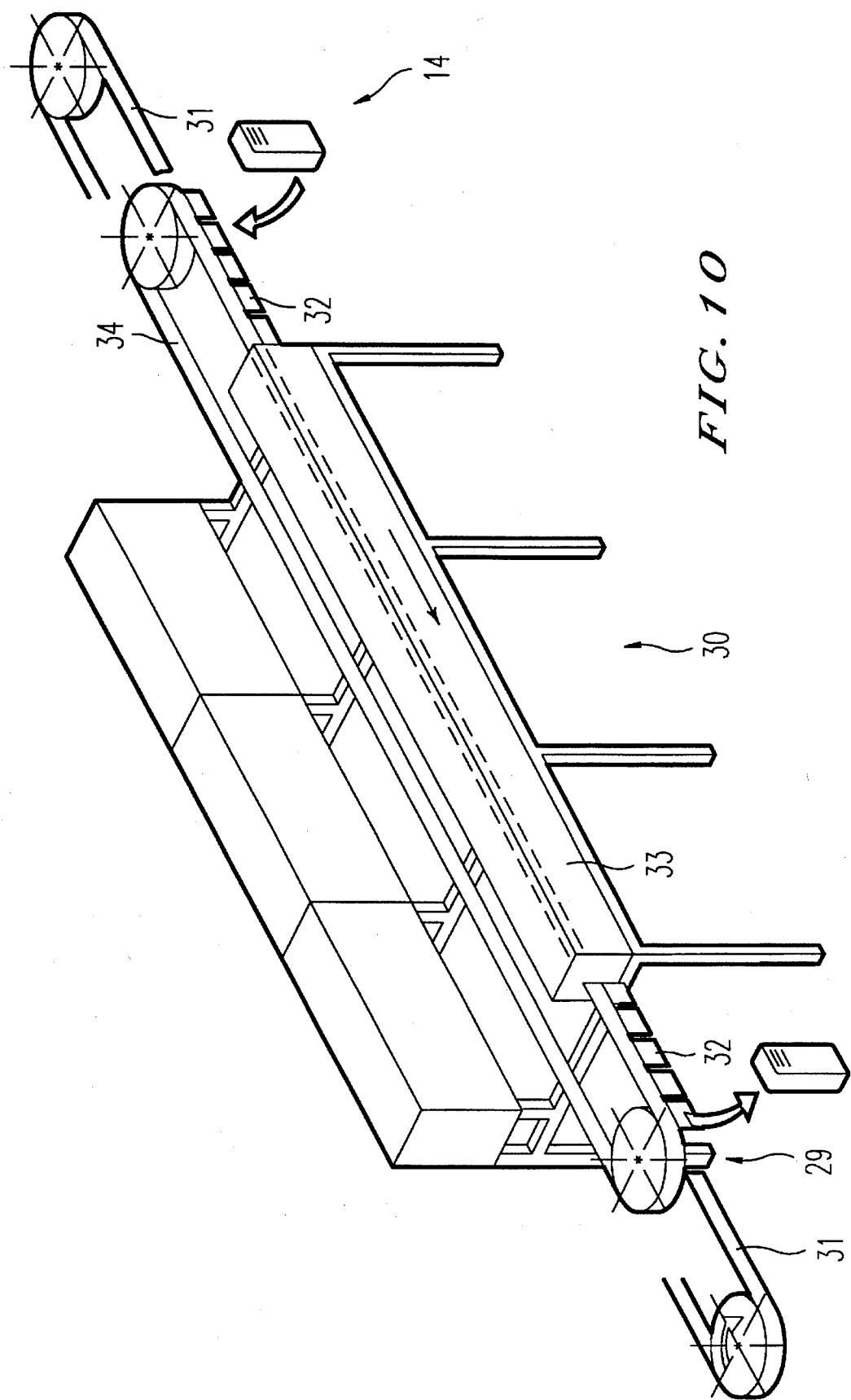
FIG. 10 is a schematic perspective view of an apparatus for processing products joined in strips.

As schematically illustrated in FIG. 10, the products interconnected in elongated bands 31 or in short strips 32 are fed to the apparatus 30 nearby the feed station 14 of the apparatus, and then transported, by means of a conveyor belt 34, through a processing part 33 forming part of the apparatus 30, in which the above stations 15–28 are arranged. The treated products are subsequently discharged in the unload station 29.

The design of the clamping means (not shown in FIG. 10) is very important. When the clamping means press the products interconnected in elongated bands or in short strips against the flat endless conveyor belt with their flat connecting strips, a capillary space is formed between the conveyor belt and the connecting strip, in which residual processing liquid may remain behind. Such residual liquid might contaminate the end product after the products have been discharged from the apparatus.

FIGS. 11–13 show an embodiment of a clamping means, with an open space -A- (FIG. 13) present between product and conveyor belt. This space has been obtained by perpendicularly flanging a small width of one side 36 of each of the slots 37 provided in the bottom of the conveyor belt 34. Clamping means 35 secured in the conveyor belt 34 (see EP-A-0382283) press parts of the bands 31 or strips 32, as the case may be, against the flanged sides 36 of the conveyor belt.

FIGS. 14–16 show another embodiment of a clamping means. In this embodiment both sides 36' of the slots 37 in the conveyor belt 34 are flanged perpendicularly. In addition to that the clamping bottom end of a clamping means 35 is provided with a recess 38 in this embodiment, as a result of which rinsing of the products 32 clamped down on the conveyor belt 34 is facilitated even further.

As described in EU-A-0507043 it is desirable to vibrate the products at a frequency of preferably at least 3,000 vibrations per minute during the electrophoretic application of the photosensitive layers. This in order to prevent irregular coating due to the presence of gas bubbles in the electrophoretic resist bath. Such vibrating of the products is undesirable in the apparatus according to the invention, since the vibrations would propagate over the entire apparatus via the endless conveyor belt, possibly having an adverse effect on the various other processing stages.

Figure 17:
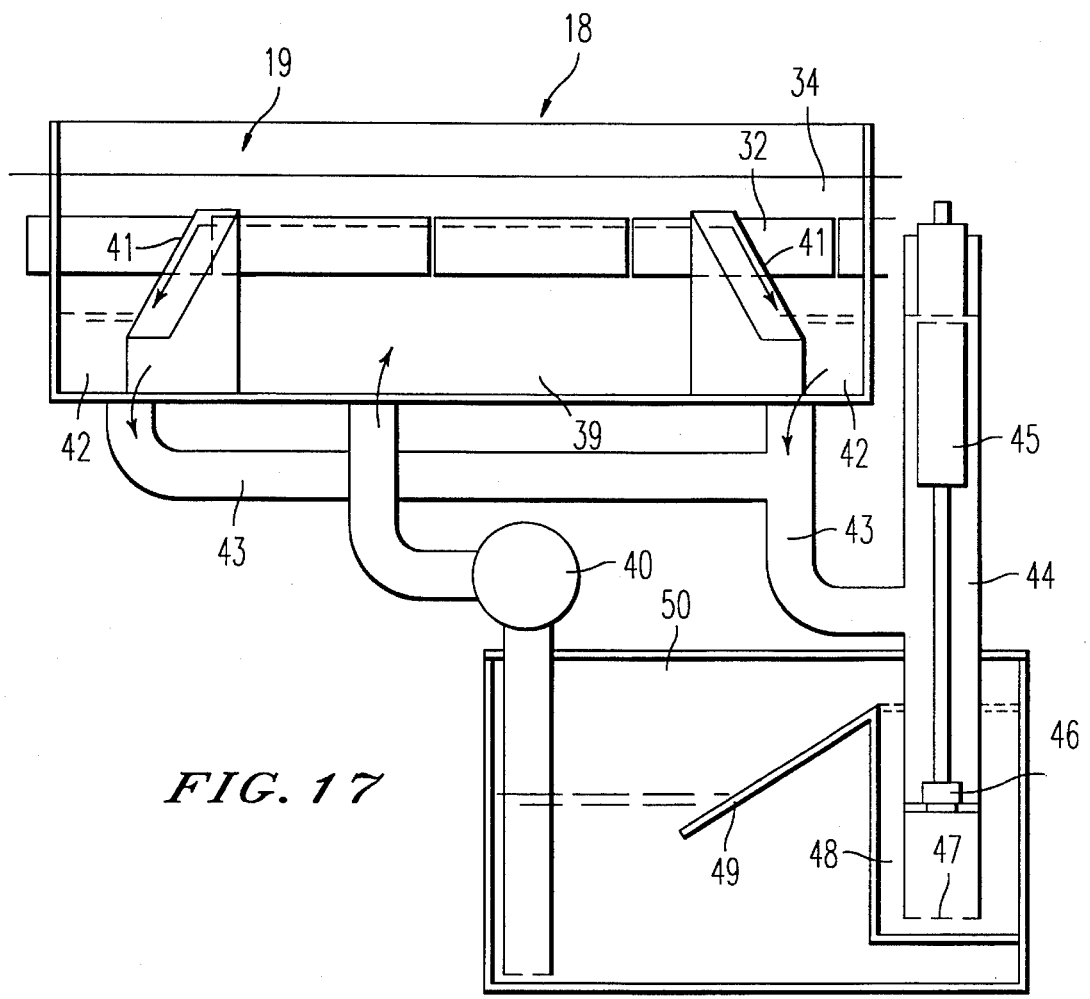
FIG. 17 is a schematic view of an embodiment of the electrophoretic bath for applying a photosensitive resist layer to the products and of provisions for removing gas bubbles present in the electrophoretic resist liquid.

FIGS. 17–20 schematically illustrate an embodiment of the station 18 indicated in FIG. 9, wherein the degassing of the electrophoresis liquid is obtained in a different manner. The products 31 or 32 interconnected in elongated bands or strips respectively are transported by means of the conveyor belt 34 through a bath 39 for electrophoretically applying the photosensitive resist layer. The resist liquid is charged to the treatment bath 39 by means of a pump 40, from where the liquid overflows into compartments 42 via sloping rollers 41 forming a sluice, and from there through pipes 43 to a vertical float tower 44 (FIG. 17). The level of the resist liquid inside the compartments 42 can be adjusted by means of a vertically adjustable float 45 located inside the tower 44. Any excess resist liquid can flow from the tower into a compartment 48 via a float-controlled valve 46 connected to the float 45 and an opening 47 provided nearby the bottom side of the float tower. Inside the compartment 48 a predetermined liquid level is maintained. When the compartment 48 is full, any excess liquid will flow via a guide channel 49 into a bath 50, from where the liquid may be recirculated again by the pump 40.

Figure 18:
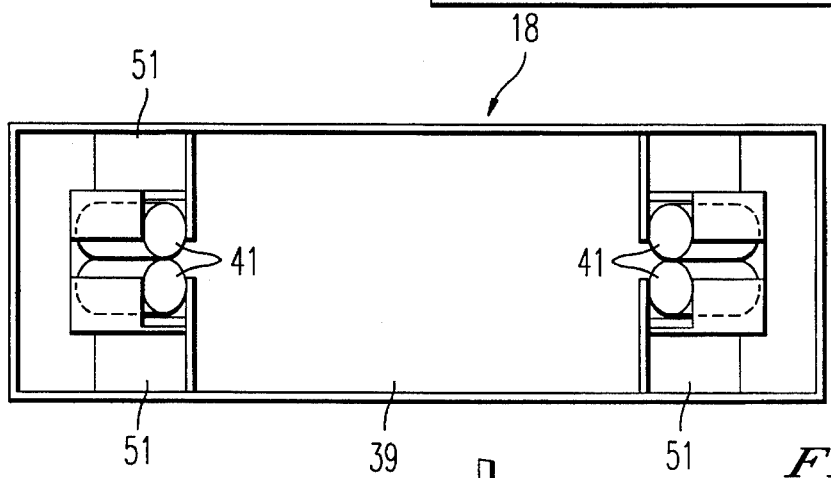
FIG. 18 is a plan view of FIG. 17.
Figure 19:
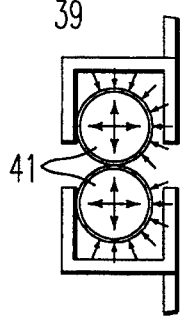
FIG. 19 is an elevational view of rollers forming a sluice, substantially according to the arrow XIX in FIG. 17.
Figure 20:
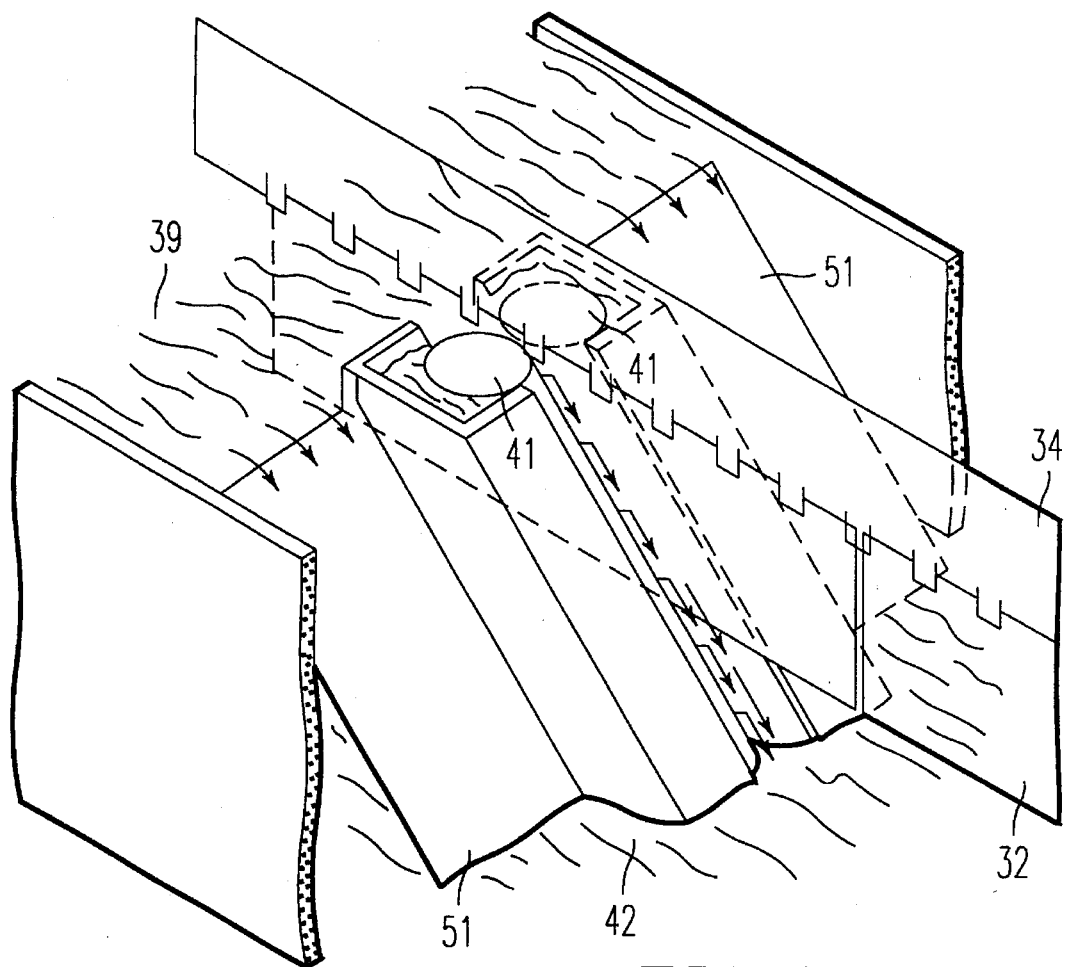
FIG. 20 is an enlarged view of the inlet or outlet of the electrophoretic bath for applying the photosensitive resist layer.

FIG. 19 schematically illustrates a sluice formed by the rollers 41. The liquid present in the bath 39 exerts a pressure on the rollers 41, as indicated by means of the arrows in FIG. 19. When no products are present between the rollers 41 of the roller sluices, the rollers close the compartment or bath 39 practically completely. During transport of the products through the rollers 39 a small flow of liquid flows through the roller sluices into compartments 42. The remaining excess resist liquid likewise flows back into the compartments 42 through overflow channels 51 disposed beside the roller sluices (FIGS. 18 and 20).

Due to the sloping position of the rollers 41 and the sloping overflow channels 51 it is prevented that air bubbles are included in the resist liquid as a result of the liquid being circulated.

The arrangement of the various parts and fittings in the electrophoretic bath for applying the photosensitive resist layer to the interconnected products, as schematically illustrated in FIGS. 17–19, ensures that the electrophoretic liquid cannot be mixed with air, while gas bubbles formed during the electrophoretic treatment can escape from the liquid in the compartments 42, in the float tower 44 and finally on the chute 49, over which the liquid flows back in a very thin layer into the storage container 50. Here any gas bubbles remaining behind in the liquid can readily escape through the thin liquid film.

Figure 21:
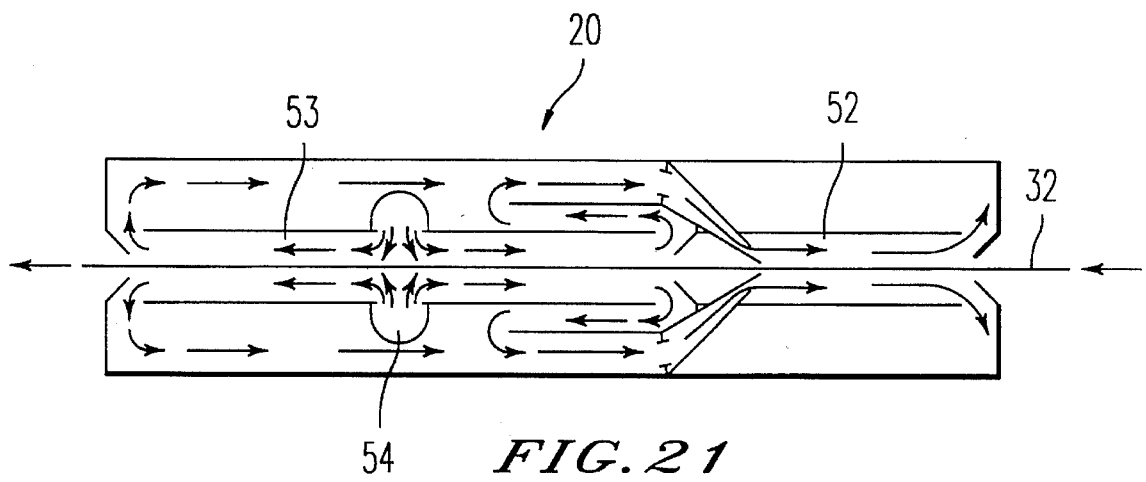
FIG. 21 is a schematic plan view of a station in which drying of the applied photosensitive resist layer takes place.

After application of the photosensitive resist layer the product is introduced into the station 20 via the rinsing station 19 (FIG. 9), in which station 20 drying of the resist film takes place. As shown in FIG. 21 the station may be provided with a entry section 52 and a coagulation section 53. Via an entry gate 54 hot air may be introduced into section 53, in which coagulating of the resist film takes place. The flow pattern of the hot air is indicated by arrows in FIG. 21. Part of the hot air initially flows through the coagulation section in the direction of travel of the products, and is diverted in the direction of the upstream end of the drying station at the end of the apparatus, where it is combined with the part of the supplied air which has flown from the entry gate 54 through the coagulation section 53 in upstream direction, against the direction of travel of the products. Then the air, which has slightly cooled down in the coagulation section, flows into the entry section 52, where any residual water present on and in the resist layer, is effectively evaporated.

After drying, the products are transported along to the exposure station 21, FIG. 9, in which those parts of the products are exposed on which the resist layer must remain behind during the subsequent developing process in order to mask those parts of the products that must not be plated when subsequently a metal is selectively plated.

The above description is based on the use of a negative photoresist. It is also possible, however, to use a positive photoresist.

When a negative photoresist is used the non-exposed photoresist layer is removed from the non-exposed part of the product during developing of the photoresist layer following exposure, while after developing the photoresist layer applied remains behind on the exposed parts of the product. The products in particular aimed at, such as the leadframes, are generally only plated on one side, while plating of the other side and of the cut edges of the apertures formed in the products must be avoided. Based on this it is preferred to use a negative photoresist, whereby only the parts of the products to be plated must be masked during exposure and a photoresist layer is obtained on the cut edges as well, by exposing the products thus masked in a desired manner from two sides, which photoresist layer remains behind on the cut edges upon developing in order to prevent plating material from being deposited thereon.

Within the spirit and scope of the invention it is also possible, however, to use positive photoresists, whereby, when such positive photoresists are used, it is exactly the exposed parts which are removed from the products when developing takes place following exposure. Consequently all the parts of the products that must not be plated must therefore be covered during exposure when a positive photoresist is being used. It will be particularly difficult thereby to maintain a satisfactory covering of a photoresist layer on the cut edges of the apertures provided in the product.

Furthermore electrophoretical photosensitive resists exist which can be deposited both at a cathode or at an anode. Although the method and the apparatus according to the invention can be used for both systems, it is preferred to use cathodically operating systems, because with anodically operating systems there is a risk of the resist bath being contaminated with metal from the products to be processed.

Figure 22:
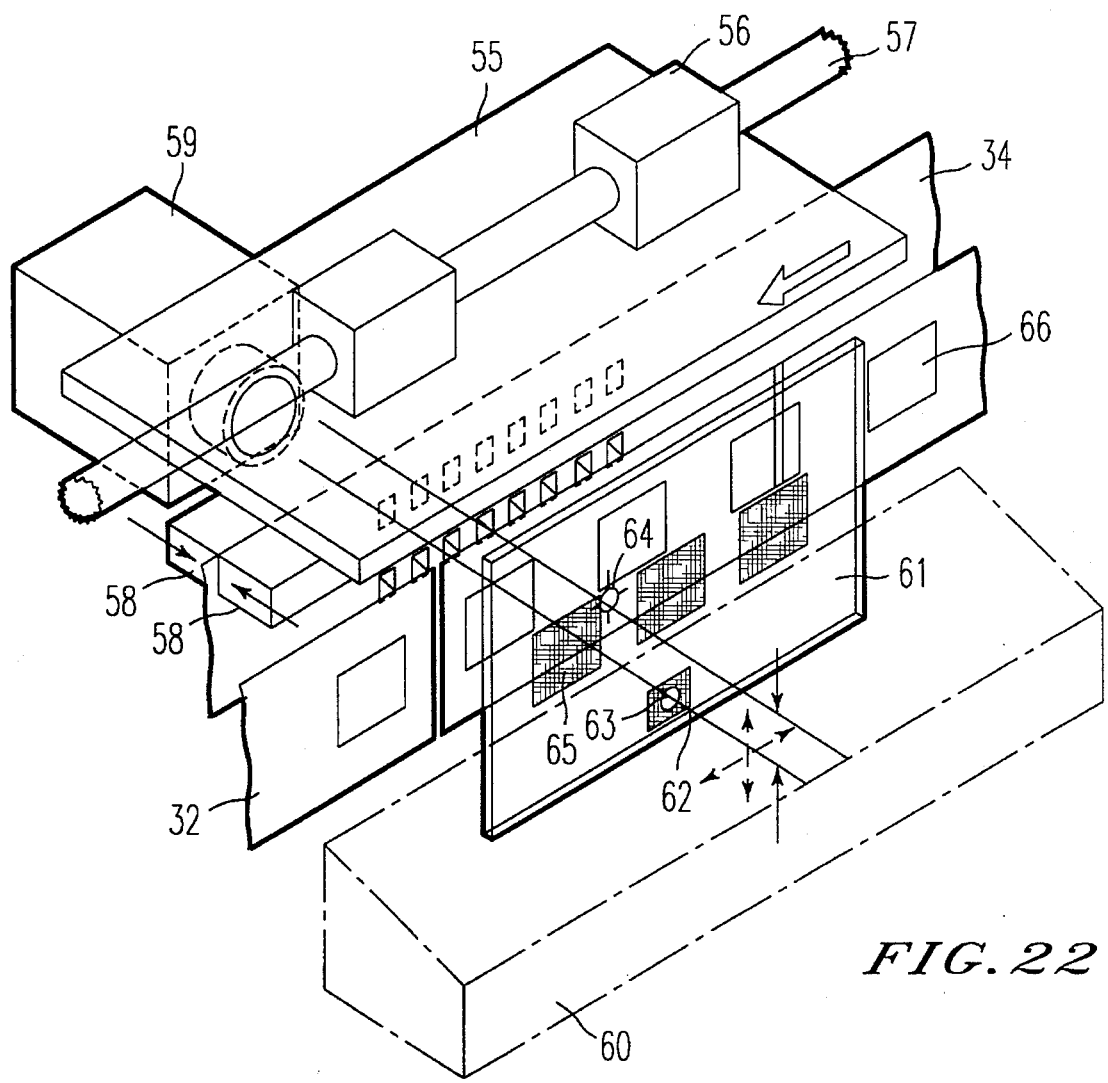
FIG. 22 is a schematic view of an exposure station and the positioning of a mask.

FIG. 22 shows a simplified schematic arrangement of the station 21 for positioning the mask relative to the photoresist-covered products and the subsequent exposure.

In the illustrated embodiment the station 21 comprises a mounting plate or building-in bracket 55, on which guide blocks 56 are mounted, which can move slidingly over fixedly disposed rods 57. For the sake of simplicity only one of the two rods 57 and the blocks 56 cooperating therewith are shown in the Figure. Furthermore clamping pieces 58, which are movable in directions towards and away from each other, are mounted on the mounting plate 55. Furthermore a positioning camera 59 and a mask 61, which is connected to positioning motors, are connected to the mounting plate. A fixedly disposed housing of the exposure source is schematically indicated at 60.

Figure 23:
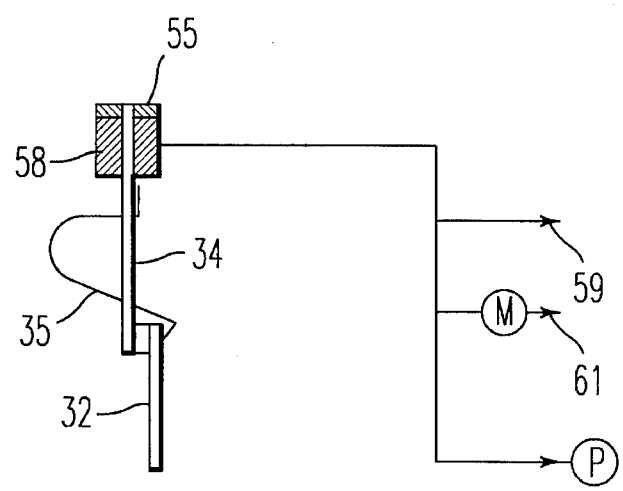
FIG. 23 shows a diagram in which the connection between conveyor belt and exposure plant is schematically illustrated.

In FIG. 23 all this is illustrated in a diagram, wherein -M- indicates the motors and P indicates any auxiliaries, which take care of the correct positioning of the mask 61. The diagram will show that in station 21 the products 31 or 32, in particular the conveyor belt 34, can be clamped on to the mounting plate 55, thus taking up a fixed position relative to the mounted parts.

Upon arrival of a strip of interconnected products or a part of products interconnected in elongated bands the successive steps in the exposure station 21 of FIG. 22 are the following:

a) The clamping pieces 58 connect the mounting plate 55, which is slidably movable along the rods 57, and the parts mounted thereon to the continuously moving conveyor belt 34.
b) The roughly positioned mask 61, which is located at a short distance from the products 31 or 32, is moved to the correct, predetermined position relative to reference holes 64 (FIGS. 1, 22) in the products 32 to be exposed by means of the camera 59, a reference aperture 63 (FIG. 22) in a masking surface 62 provided at the bottom of the mask and furthermore by means of the positioning motors -M- (FIG. 22).
c) Then the mask 61 is lightly pressed against the products 32 by pneumatic means (not shown in the drawing).
d) After the removal of a shutter plate (not shown) which screens the exposure source, exposure is effected for 1–2.5 seconds by means of the powerful light source disposed within the housing 60.
e) After the exposure has been stopped the shutter plate is closed again and the clamping apparatus 58 is opened, after which a transport means (not shown in the drawing) returns the mounting plate with the parts mounted thereon to the starting position against the direction of travel of the belt 34.

FIG. 21 shows, by way of example, surfaces 65 on the mask, which have been made opaque to UV light and which prevent exposure of corresponding surfaces 66 of the products interconnected in bands 31 or strips 32, so that the photosensitive layer can be removed from these parts of the products in the developing station (FIG. 9), following on which the parts can be plated with a metal.

Figure 24:
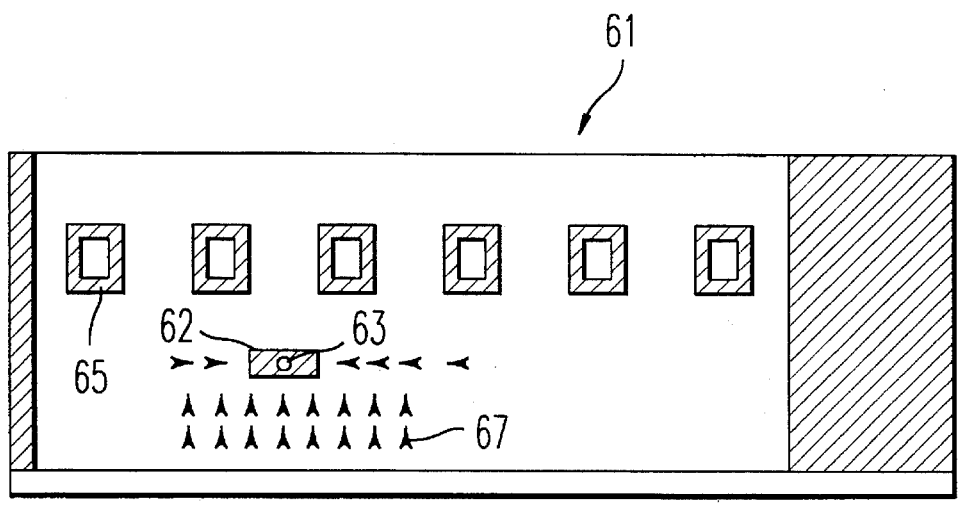
FIG. 24 shows an alternative embodiment of a photomask for the production of annular metal coatings.

FIG. 24 shows another embodiment of a mask 61 provided with rectangular masking surfaces 65, which are provided with a central light-transmitting opening. This makes it possible to mask only those parts of the leads 6 (FIG. 1) which are located nearby the platform 5, as a result of which it is possible to plate only those ends of the leads 6 with a metal following exposure and developing. The small arrows on the mask 62 indicated at 67 are used for mounting the mask in the exposure apparatus of FIG. 22 quickly and accurately.

Figure 25:
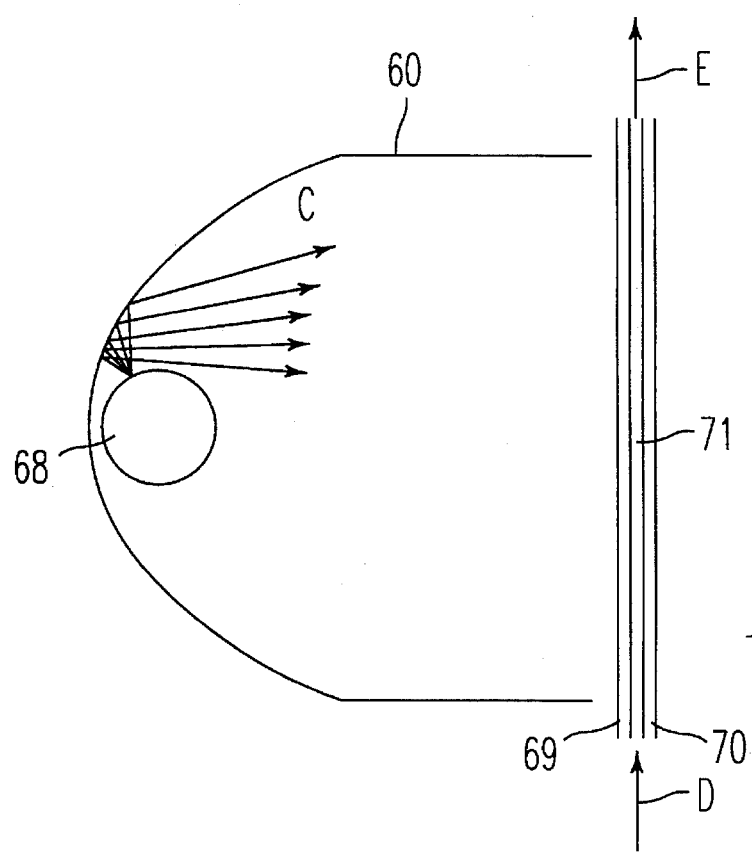
FIG. 25 shows the arrangement of an exposure lamp with a reflector and a heat-dissipating apparatus.

FIG. 25 schematically illustrates the arrangement of a powerful exposure source 68 within the housing 60, which is internally provided with a reflecting material. A specific characteristic of most photosensitive resists is that on the face of it they appear to be dry, but under the influence of time and/or temperature they exhibit a tendency to stick. Although the exposure time can be kept very short, due to the use of a very powerful exposure source 68, the thermal energy supplied is at the same time so high that there is a danger that the resist layer of the non-exposed parts 66 of the products 31 or 32 (FIG. 22) will stick to the abutting mask 61, which is undesirable, of course. In order to prevent this risk of sticking, two glass plates 69 and 70 forming a closed space 71 are disposed between the light source 68 and the mask 61, whereby water is circulated through the space 71 by means of a pump (not shown), as indicated by the arrows D and E. It has become apparent thereby, that 99% of the thermal energy of the Infrared radiation emitted by the light source 68 is dissipated by the circulating water, while the Ultraviolet light required for exposure can pass virtually unimpeded through the glass plates 69 and 70 and the water film in the space 71. By incorporating a cooling arrangement (not shown) in the circulation system for the water, the temperature of the water can be adjusted to the desired level.

In FIG. 25 the arrows C furthermore illustrate the radiation C emitted by the light source 68. The selected configuration of the housing 60 provides a certain dispersion of the radiation C, as a result of which a satisfactory exposure also of the cut edges of the apertured products is ensured.

The exposure of the sides of the products facing away from the mask, which need not be plated, may take place simultaneously with or shifted in time relative to the exposure of the front sides of the products. By properly controlling the intensity and duration of the exposure complete curing of the photoresist layer will be possible, also on the cut edges of the products.

The products thus exposed are then transported through a developing bath, with a view to removing the photoresist layer from the surfaces to be plated with a metal, after which the products are transported through a bath for conventionally electroplating the desired metal.

When a negative photoresist is used it will be preferred to use slightly acid developing liquids with a base of organic acids, such as for example lactic acid, for the developing step.

Then the parts of the products that have been uncovered so as to be plated will usually be lightly etched in station 23 in order to obtain a clean surface, that is, for example immersed in a solution of ammonium persulphate or of diluted sulphuric acid with hydrogen peroxide, when the basic material of the products is copper. When the products are made of a nickel-iron alloy the products may be immersed in a solution of oxalic acid and hydrogen peroxide for mild etching.

In connection with the presence of the photoresist layer on the products, electrolysis baths with a pH in the range of about 2–9.5 are suitable for the intended selective electroplating of the products in stations 24 and 25 (FIG. 9).

Figure 26:
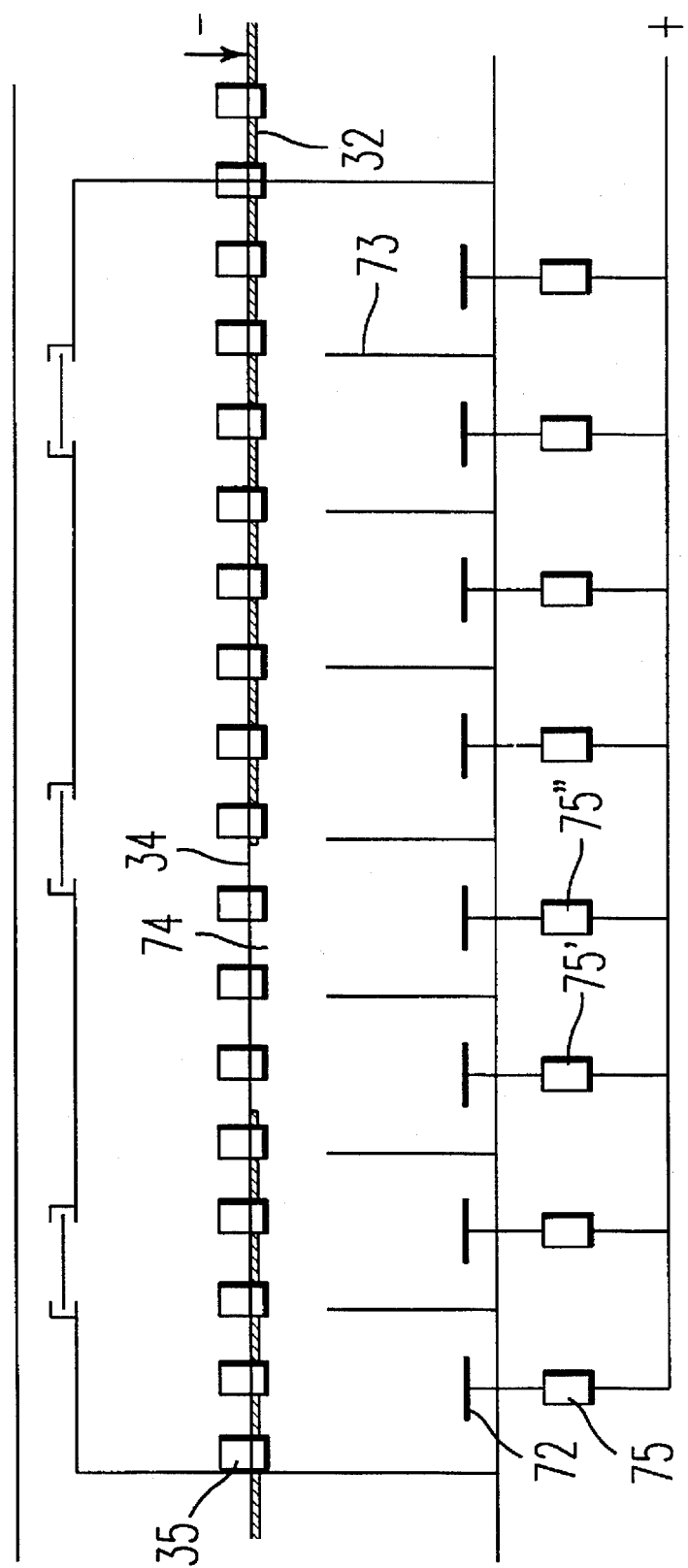
FIG. 26 is a schematic plan view of a preferred embodiment of the electroplating bath.

FIG. 26 diagrammatically shows a plan view of a preferred arrangement of the electroplating bath. The figure shows the products 31 or 32 and the conveyor belt 34 with clamping means 35, while reference numeral 72 indicates anodes. The individual anodes 72 are disposed separate from each other by means of partitions 73 of plastic material, as a result of which the direct current of the anodes connected to the positive lead of a DC source is passed in a more or less parallel manner to the product or part of a product forming a cathode, which is located opposite the respective anode.

Upon starting up and stopping of the plating section or when one or more product strips 31 or 32 are missing in case of incorrect loading, as indicated at 74 in FIG. 26, there is a risk of excessive growth of the metal coating and consequently of products being rejected.

In order to prevent the risk of producing products that will be rejected, on one hand the partitions 73 are provided while on the other hand the anodes 72 are connected to the positive power supply via relays 75.

The loading information of the apparatus upon start-up, termination of production or incorrect loading is stored in a control computer and subsequently used for controlling the relays 75.

Upon start-up only the relay of the first compartment is connected when the first product strip enters the apparatus, so that only the first anode delivers current. Upon continued loading of the plating bath following anodes are successively connected.

When a product strip is missing, as indicated at 74 in FIG. 26, the current supply of each of the anodes located opposite the open position is successively cut off in the position according to FIG. 26, for example by operating the relays 75' and 75".

In this manner it is prevented that the products of the strips adjacent to the open position 74 would receive an excessive amount of current, which would lead to overly thick or burned metal coatings and thus to rejects. The arrangement of the partitions 73 and the computer-controlled connecting and disconnecting of the anodes 72 by means of the relays 75 guarantee that close to 100% of the products will meet specifications.

After the intended plating has been carried out the remaining photoresist layer is removed in station 26 (FIG. 9), for which purpose aqueous solutions of certain acids or alkalis are effectively used at temperatures of 30°–65° C.; generally a strong agitation of liquid is desired. Since the alkaline strippers mostly contain environment-unfriendly solvents, it is preferred to used acidic solutions for stripping the resist layer.

Then a final cleaning may be effected in station 27, by means of alkaline electrolytic degreasing baths.

Subsequently the products may be rinsed and dried.

It will be apparent, that the apparatus according to the invention may also be used effectively for plating other metals besides silver, such as for example gold or a combination of nickel and gold.

Figure 3:
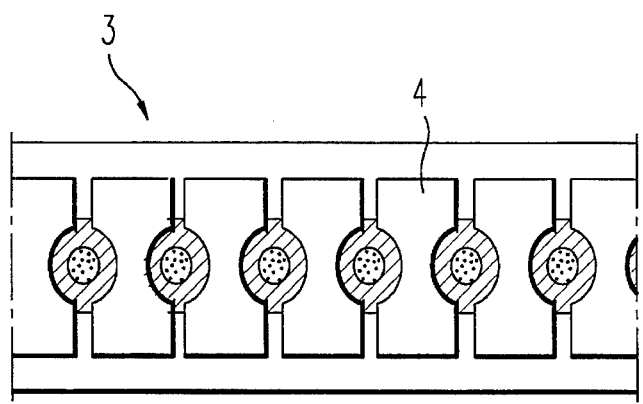
FIG. 3 is a schematic view of a plurality of products interconnected in a band or strip, which are intended for use in contact systems.
Figure 4:
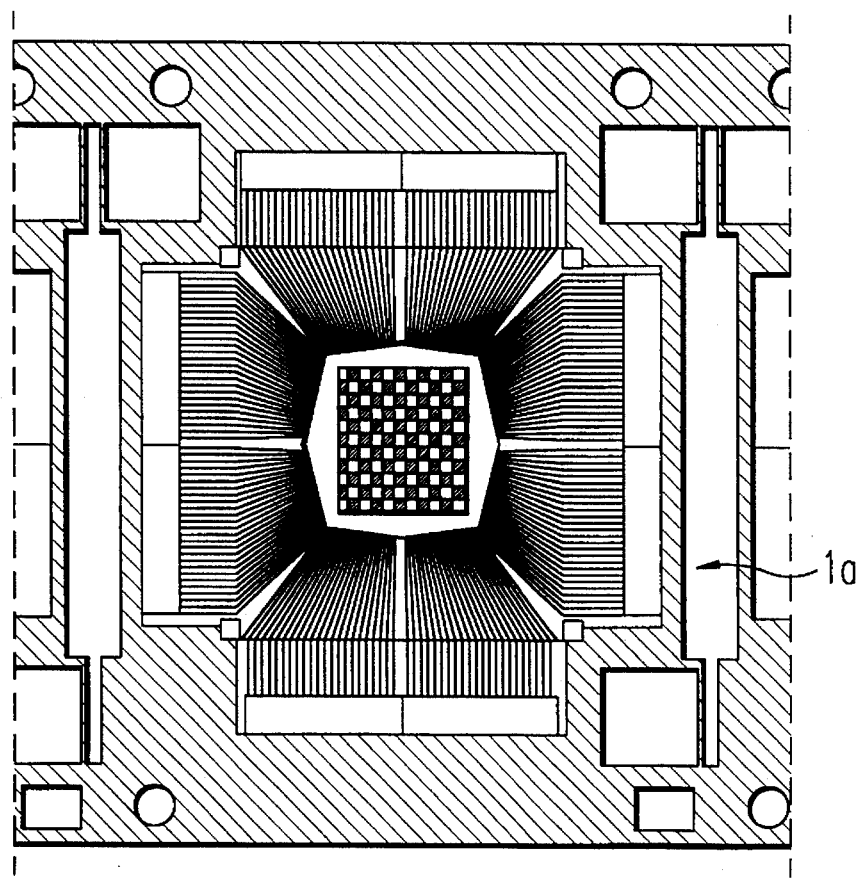
FIG. 4 is a view of a leadframe with a large number of leads.
Figure 5:
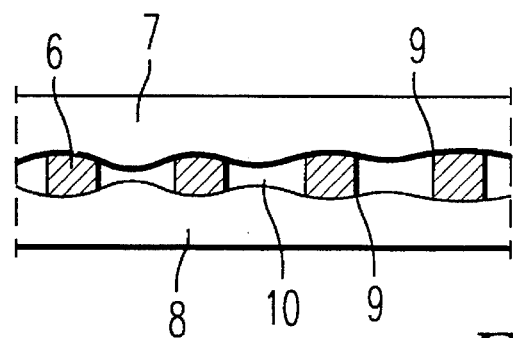
FIG. 5 is a schematic sectional view of a number of leads of a leadframe, which are clamped between masking means.

FIG. 3 for example shows a plurality of contact means, which are joined in a band, for a pressure contact as used in computer keyboards. Although the surface indicated at "4" has certain dimensions, for example, a diameter of 4 mm, with a view to the mechanical strength of such contacts, the functional part of the contact, the part illustrated in black in FIG. 3, has a diameter of for example 2 mm. Such selective plating of gold can be realized in a highly efficient manner by using the method according to the invention, whereby in many cases savings of precious metals of 75% or more are attainable. In the example referred to the saving of gold per one million contacts amounted to about 3.75 kg, with a nominal layer thickness of 2 µm, consequently representing a value of about $50,000 U.S. dollars, while every year many millions of such contacts are produced.

Finally it will be apparent to those skilled in the art that the apparatus according to the invention is not only suitable for plating metals, but also for photochemically etching products, such as leadframes, printed circuits and the like. In the case a chemical or electrochemical etching process is carried out in stations 24 and 25. In the stations excess material is therefore etched from for example a strip-shaped basic product.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An apparatus for selectively electroplating apertured metal or metallized products, the apparatus comprising:

a loading station wherein said products are loaded onto means for fully continuously transporting said products through said apparatus;

a pretreatment section wherein said products are cleaned, deoxidized and washed;

a bath for applying an electrophoretic photoresist layer to said products while said products are being transported through said bath;

a source of direct current for providing a required current for an electrophoretic process for applying the photoresist layer from said bath;

means for rinsing and drying of the electrophoretic photoresist layer on said products;

means for exposing said photoresist layer;

at least one photomask and means for horizontally and vertically adjusting the photomask relative to the products under an influence of a detecting apparatus which detects marks present on the products and the photomask;

means for moving said photomask, said detecting apparatus and said means for horizontally and vertically adjusting the photomask, along with the products during adjustment of the photomask and during exposure and, following exposure, moving in a direction opposite to a direction of travel of the products;

means for developing the exposed photoresist layer to remove the photoresist from areas which subsequently require a metal deposit;

means for rinsing and activating said areas requiring a metal deposit;

a bath for electrodeposition of a metallic coating on said areas which require a metal deposit;

means for rinsing said products to remove remaining electrolyte;

means for stripping the exposed photoresist layer which has served as a mask during the electrodeposition process;

means for final cleaning, rinsing and drying of said products;

means for unloading said products from said transport means; and means for driving said transport means in a fully continuous mode.

2. An apparatus according to claim 1, wherein said mask is a glass plate or a glass plate with film material laminated thereon, said glass plate being made opaque at desired locations.

3. An apparatus according to one of claims 1 or 8, further comprising two light-transmitting plates disposed between said mask and a light source for exposing the products, and means for transporting cooling liquid between said plates.

4. An apparatus according to claim 1, wherein two spaced-apart pairs of rollers are provided in the bath for electrophoretically applying the photoresist in such a manner that the products can be passed between said rollers.

5. An apparatus according to claim 4, wherein the rollers of the two pairs of rollers are disposed in such a manner, that the axes of rotation of the one pair of rollers slope upwards in the direction of the axes of rotation of the other pair of rollers, which axes of rotation slope upwards in the direction of the axes of rotation of said first pair of rollers.

6. An apparatus according to claim 5, further comprising overflows provided beside said pairs of rollers, said overflows being provided with obliquely disposed plates for overflowing liquid.

7. An apparatus according to claim 6, further comprising an adjustable valve for controlling the flow of the liquid from the bath, said valve being disposed in a buffer reservoir for liquid, the buffer reservoir being equipped with an overflow with obliquely disposed plates for transporting overflowing liquid to a storage tank.

8. An apparatus according to claim 1, further comprising a drying station, with a space provided for a coagulation section and with a predrying section disposed upstream thereof, and means for supplying hot air to the coagulation section and for diverting said hot air in order for said air to be passed through said predrying section.

9. An apparatus according to claim 1, wherein said bath for plating products which are transported through said bath has a plurality of spaced-apart anodes which are arranged one behind the other in said bath, as seen in the intended direction of travel of the products, and partitions are disposed between said anodes, and means are provided, by which said anodes can be selectively connected to a power source.

10. An apparatus according to claim 9, further comprising means for controlling an energizing of the anodes in such a manner that said anodes are successively connected, dependent on the travel of the products through the bath.

11. An apparatus according to claim 10, further comprising means for detecting whether products to be plated with a metal are present in the bath or not, wherein said means may or may not provide anodes with current, dependent on whether or not a product is located opposite said anodes.

12. An apparatus for selectively electroplating apertured metal or metallized products, the apparatus comprising:

a loading station wherein said products are loaded onto means for continuously transporting said products through said apparatus;

a pretreatment section wherein said products are cleaned;

a bath for applying an electrophoretic photoresist layer to said products while said products are being transported through said bath;

a source of direct current for providing a required current for an electrophoretic process for applying the photoresist layer from said bath;

means for rinsing and drying of the electrophoretic photoresist layer on said products;

means for exposing said photoresist layer;

at least one photomask and means for horizontally and vertically adjusting the photomask relative to the products under an influence of a detecting apparatus which detects marks present on the products and the photomask;

means for moving said photomask, said detecting apparatus and said means for horizontally and vertically adjusting the photomask, along with the products during adjustment of the photomask and during exposure and, following exposure, moving in a direction opposite to a direction of travel of the products;

means for developing the exposed photoresist layer to remove the photoresist layer from areas which subsequently require a metal deposit;

means for rinsing and activating said areas requiring a metal deposit;

a bath for electrodeposition of a metallic coating on said areas which require a metal deposit;

means for rinsing said products to remove remaining electrolyte;

means for stripping the exposed photoresist layer which has served as a mask during the electrodeposition process;

means for a final cleaning treatment of said products;

means for unloading said products from said transport means; and two light-transmitting plates disposed between said mask and a light source for exposing the products, and means for transporting cooling liquid between said plates.

13. An apparatus for selectively electroplating apertured metal or metallized products, the apparatus comprising:

a loading station wherein said products are loaded onto means for continuously transporting said products through said apparatus;

a pretreatment section wherein said products are cleaned;

a bath for applying an electrophoretic photoresist layer to said products while said products are being transported through said bath;

a source of direct current for providing a required current for an electrophoretic process for applying the photoresist layer from said bath;

means for rinsing and drying of the electrophoretic photoresist layer on said products;

means for exposing said photoresist layer;

at least one photomask and means for horizontally and vertically adjusting the photomask relative to the products under an influence of a detecting apparatus which detects marks present on the products and the photomask;

means for moving said photomask, said detecting apparatus and said means for horizontally and vertically adjusting the photomask, along with the products during adjustment of the photomask and during exposure and, following exposure, moving in a direction opposite to a direction of travel of the products;

means for developing the exposed photoresist layer to remove the photoresist layer from areas which subsequently require a metal deposit;

means for rinsing and activating said areas requiring a metal deposit;

a bath for electrodeposition of a metallic coating on said areas which require a metal deposit;

means for rinsing said products to remove remaining electrolyte;

means for stripping the exposed photoresist layer which has served as a mask during the electrodeposition process;

means for final cleaning treatment of said products;

means for unloading said products from said transport means; and a drying station, with a space provided for a coagulation section and with a predrying section disposed upstream thereof, and means for supplying hot air to the coagulation section and for diverting said hot air in order for said air to be passed through said predrying section.

14. An apparatus for selectively electroplating apertured metal or metallized products, the apparatus comprising:

a loading station wherein said products are loaded onto means for continuously transporting said products through said apparatus;

a pretreatment section wherein said products are cleaned;

a bath for applying an electrophoretic photoresist layer to said products while said products are being transported through said bath;

a source of direct current for providing a required current for an electrophoretic process for applying the photoresist layer from said bath;

means for rinsing and drying of the electrophoretic photoresist layer on said products;

means for exposing said photoresist layer;

at least one photomask and means for horizontally and vertically adjusting the photomask relative to the products under an influence of a detecting apparatus which detects marks present on the products and the photomask;

means for moving said photomask, said detecting apparatus and said means for horizontally and vertically adjusting the photomask, along with the products during adjustment of the photomask and during exposure and, following exposure, moving in a direction opposite to a direction of travel of the products;

means for developing the exposed photoresist layer to remove the photoresist layer from areas which subsequently require a metal deposit;

means for rinsing and activating said areas requiring a metal deposit;

a bath for electrodeposition of a metallic coating on said areas which require a metal deposit;

means for rinsing said products to remove remaining electrolyte;

means for stripping the exposed photoresist layer which has served as a mask during the electrodeposition process;

means for a final cleaning treatment of said products; and means for unloading said products from said transport means;

wherein said bath for plating products which are transported through said bath has a plurality of spaced-apart anodes which are arranged one behind the other in said bath, as seen in the intended direction of travel of the products, and partitions are disposed between said anodes, and means are provided, by which said anodes can be selectively connected to a power source.

* * * * *